United States Patent
Heo

(10) Patent No.: US 9,721,890 B2
(45) Date of Patent: Aug. 1, 2017

(54) SYSTEM-ON-CHIP, ELECTRONIC APPARATUS INCLUDING THE SAME, AND METHOD OF DESIGNING THE SAME

(71) Applicant: SAMSUNG ELECTRONICS CO., LTD., Suwon-si, Gyeonggi-do (KR)

(72) Inventor: Hun Heo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 86 days.

(21) Appl. No.: 14/681,413

(22) Filed: Apr. 8, 2015

(65) Prior Publication Data

US 2016/0049369 A1    Feb. 18, 2016

(30) Foreign Application Priority Data

Aug. 13, 2014 (KR) .................. 10-2014-0105429

(51) Int. Cl.
| | |
|---|---|
| H01L 25/00 | (2006.01) |
| H01L 23/48 | (2006.01) |
| H01L 23/528 | (2006.01) |
| H01L 27/02 | (2006.01) |
| H01L 27/118 | (2006.01) |

(52) U.S. Cl.
CPC ...... *H01L 23/5286* (2013.01); *H01L 27/0207* (2013.01); *H01L 27/11807* (2013.01); *H01L 2027/11881* (2013.01); *H01L 2924/0002* (2013.01)

(58) Field of Classification Search
CPC ......... H01L 24/09; H01L 24/03; H01L 24/85; H01L 24/09179; H01L 23/5268; H03H 9/205; H03H 9/175; H03H 2009/02204

USPC .... 257/698, E23.011, E21.59, 738; 327/355, 327/564–565
See application file for complete search history.

(56) References Cited

U.S. PATENT DOCUMENTS

| | | | |
|---|---|---|---|
| 6,570,195 | B2 | 5/2003 | Brunolli et al. |
| 7,076,756 | B2 | 7/2006 | Ichimiya |
| 7,161,823 | B2 | 1/2007 | Lee et al. |
| 7,304,385 | B2 * | 12/2007 | Wang ............. H01L 24/05 257/758 |
| 7,426,707 | B2 | 9/2008 | Ichimiya |
| 7,652,379 | B2 | 1/2010 | Poddar |
| 7,808,804 | B2 | 10/2010 | Kwon |
| 8,120,067 | B1 * | 2/2012 | Ko ................ H01L 23/5286 257/207 |
| 8,503,212 | B2 | 8/2013 | Jung et al. |
| 8,507,957 | B2 | 8/2013 | Hou et al. |
| 2012/0043663 | A1 | 2/2012 | Ko et al. |
| 2012/0098127 | A1 | 4/2012 | Sutardja et al. |

FOREIGN PATENT DOCUMENTS

| | | |
|---|---|---|
| JP | 20040158532 | 6/2004 |
| KR | 19970053607 | 7/1997 |
| KR | 0885920 | 2/2009 |

* cited by examiner

*Primary Examiner* — Dinh T Le
(74) *Attorney, Agent, or Firm* — Volentine & Whitt, PLLC

(57) ABSTRACT

A system-on-chip includes a substrate, a plurality of unit cells on the substrate, a first power mesh, and a second power mesh. The first power mesh includes a power rail that is connected to power terminals of the plurality of unit cells and is provided in a first metallization layer. The first power mesh also includes a power strap in a second metallization layer. The second power mesh is provided in a third metallization layer and a fourth metallization layer.

18 Claims, 10 Drawing Sheets

SYSTEM-ON-CHIP, ELECTRONIC APPARATUS INCLUDING THE SAME, AND METHOD OF DESIGNING THE SAME

PRIORITY STATEMENT

This application claims the benefit of Korean Patent Application No. 10-2014-0105429, filed on Aug. 13, 2014, in the Korean Intellectual Property Office, the disclosure of which is hereby incorporated by reference in its entirety.

BACKGROUND

The inventive concept relates to a system-on-chip, an electronic apparatus including a system-on-chip, and a method of designing a system-on-chip.

A system-on-chip (SoC) is a single chip in which substantially all of the functions of an entire system, such as a computer, are provided by an integrated circuit on a substrate. For example, a system-on-chip may include a processing block comprising a microcontroller, microprocessor, or digital signal processor, at least one block comprising an array of unit cells, such as a memory block comprising an array of memory cells, and power management circuitry for distributing power to the various blocks.

System-on-chips are being designed and relied upon in the industry to perform an increased number of functions. Therefore, the number of factors or specifications that have to be considered when designing a system-on-chip or when fabricating the system-on-chip has also increased. For example, chip size, arrangement of power lines of the power management circuitry, and prevention of signal distortion have to be considered when designing or fabricating a system-on-chip.

SUMMARY

According to an aspect of the inventive concept, there is provided a system-on-chip including a substrate, a plurality of unit cells disposed at an upper surface of the substrate, each of the plurality of unit cells having a power terminal at which power is supplied to the cell, a first metallization layer comprising a power rail electrically connected to the power terminals of the unit cells, a second metallization layer stacked on the first metallization layer and comprising a power strap, and a third metallization layer and a fourth metallization layer stacked on the first and second metallization layer. The power strap and the power rail are electrically connected to each other so as to constitute a first power mesh, and the third and fourth metallization layers comprise a second power mesh.

According to another aspect of the inventive concept, there is provided a system-on-chip including a substrate, a plurality of unit cells at an upper portion surface of the substrate, each of the unit cells having a power terminal at which power is supplied to the cell, a first metallization layer comprising a power strap, and a second metallization layer comprising a power rail electrically connected to the power terminals of unit cells. The power strap and the power rail are electrically connected to each other so as to constitute a power mesh, and the first metallization layer is interposed between the substrate and the second metallization layer.

According to yet another aspect of the inventive concept, there is provided a system-on-chip including a substrate, metallization layers stacked one above the other on the substrate, and first and second unit blocks of circuitry at an upper surface of the substrate. The circuitry of each of the first and second unit blocks includes a power terminal at which power is to be supplied to the circuitry. One of the metallization layers comprises a conductive power rail electrically connected to the power terminals of the first and second unit blocks of circuitry. The power rail extends longitudinally in one direction over the substrate. Another of the metallization layers comprises a conductive strap extending in another direction perpendicular to the one direction. The conductive power rail and the conductive strap cross each other and are electrically connected so as to constitute a power mesh. The conductive strap is disposed laterally of the first and second unit blocks of circuitry, and lies over a region of the upper surface of the substrate that is devoid of circuitry.

BRIEF DESCRIPTION OF THE DRAWINGS

Representative embodiments of the inventive concept will be more clearly understood from the following detailed description taken in conjunction with the accompanying drawings in which.

DETAILED DESCRIPTION OF THE PREFERRED EMBODIMENTS

Figure 1:
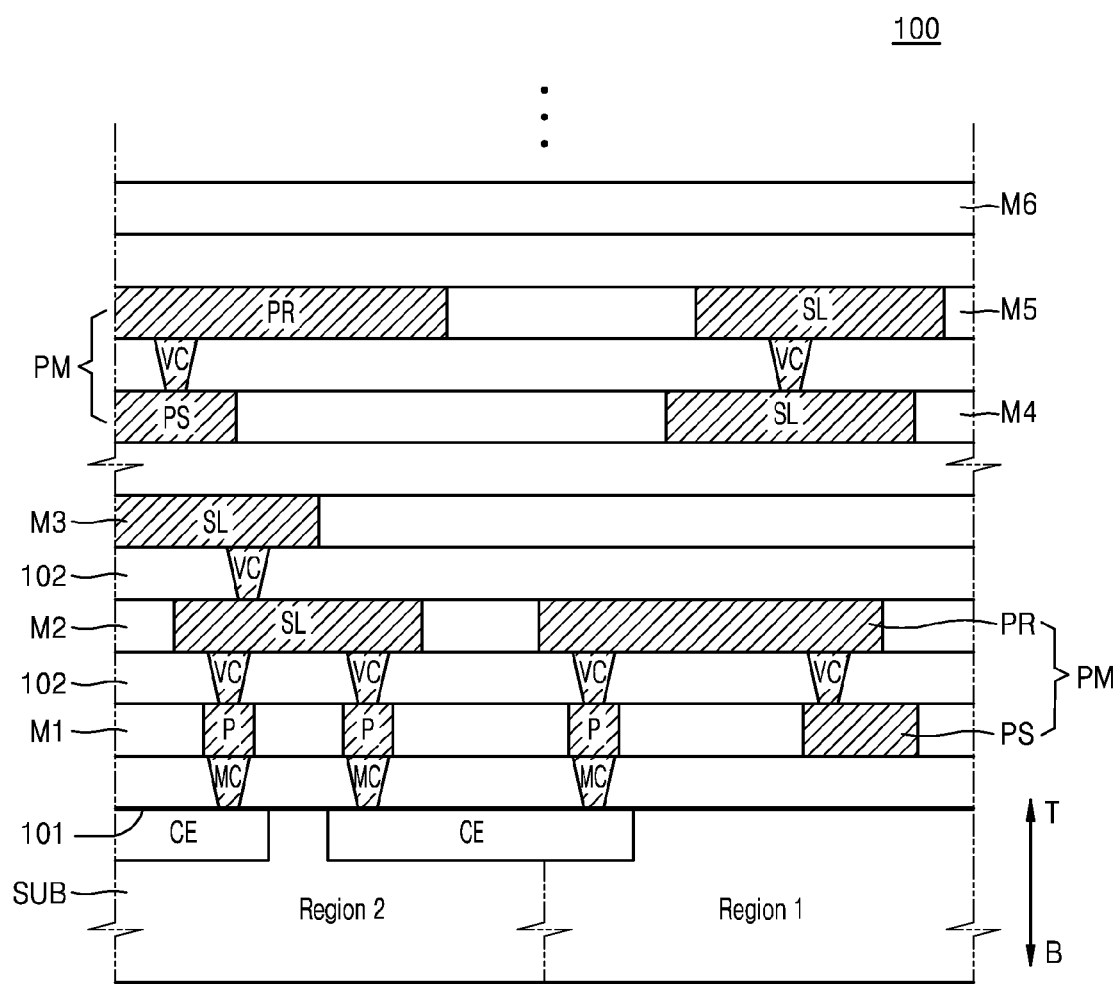
FIG. 1 is a sectional view of an embodiment a system-on-chip, taken along various lines, according to of the inventive concept.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, or as "contacting" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another region, layer or section, for example as a naming convention. Thus, a first element, component, region, layer or section discussed below in one section of the specification could be termed a second element, component, region, layer or section in another section of the specification or in the claims without departing from the teachings of the present disclosure. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

The attached drawings are provided for illustrating preferred embodiments and for use in illustrating certain aspects of the inventive concept such as the merits thereof, and the objectives accomplished by practicing the inventive concept. Therefore, unless indicated otherwise, the drawings do not limit the inventive concept. Also, like reference numerals in the drawings denote like elements. As used herein, the term "and/or" includes any and all combinations of one or more of the associated listed items. Expressions such as "at least one of," when preceding a list of elements, modify the entire list of elements and do not modify the individual elements of the list.

A system-on-chip 100 according to the inventive concept will now be described in detail with reference to FIGS. 1-3.

Figure 2:
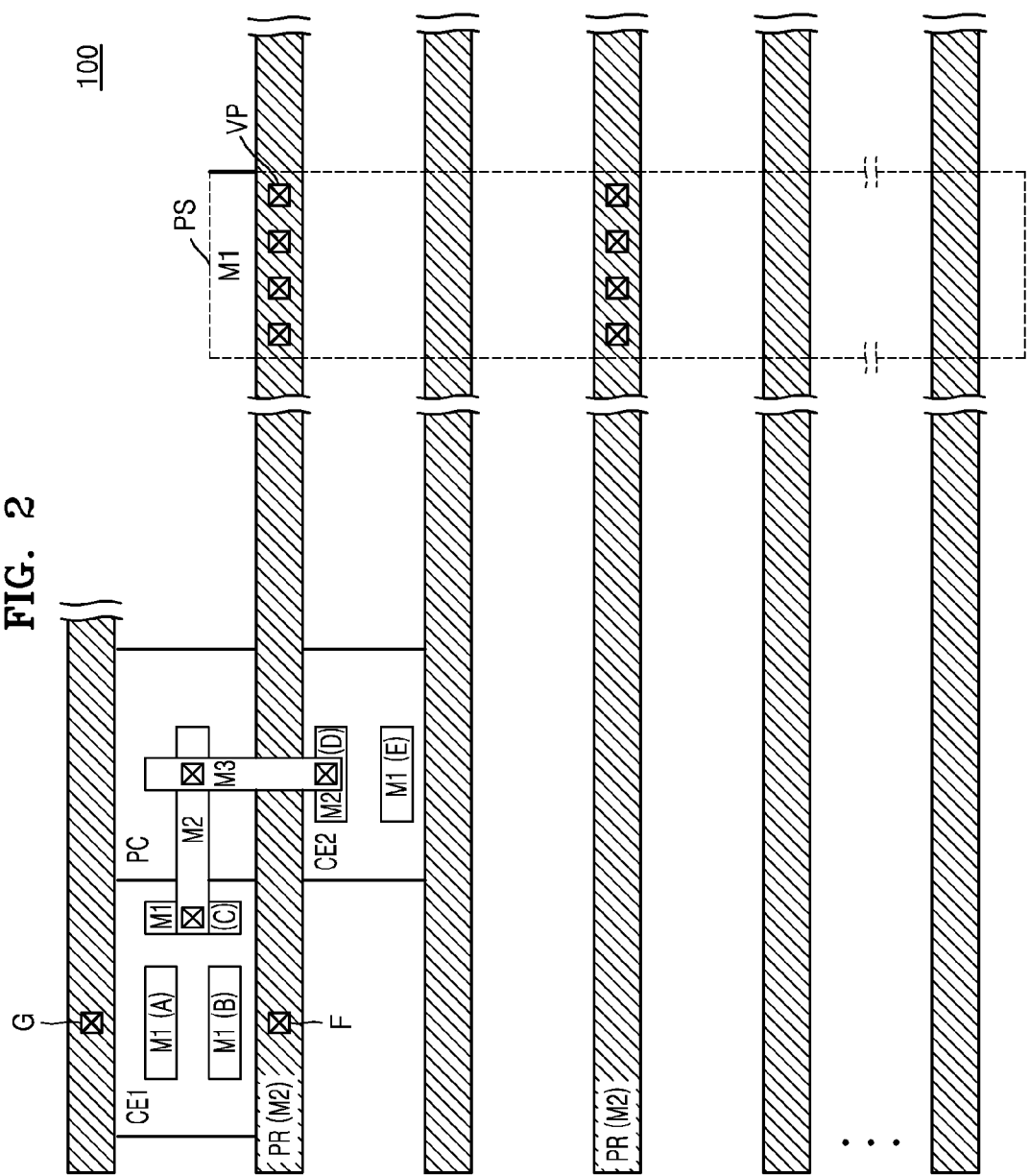
FIG. 2 is a partial plan view of the system-on-chip.

Referring first to FIGS. 1 and 2, the system-on-chip 100 includes a substrate SUB, a plurality of metallization layers M1, M2, and M3 referred to simply hereinafter as "metal" layers, and a power mesh PM.

The substrate SUB may be a silicon substrate, a silicon-on-insulator (SOI) substrate, or a silicon-germanium (SiGe) substrate. An upper portion of the substrate SUB may have a plurality of first regions (REGION 1 in FIG. 1) that are isolated from each other (as will be clear from FIG. 2), and second regions (REGION 2) discrete from the first regions. A first power mesh PM is disposed on the plurality of first regions. A second power mesh PM is disposed on upper portions of the second regions. The first power mesh is formed in a metal-1 layer M1 and a metal-2 layer M2 that will be described in more detail later, and the second power mesh may be formed in at least two of a metal-4 layer M4, a metal-5 layer M5, and a metal-6 layer M6 that will also be described in more detail later. For now, though, the numerical suffix attached to the word "metal" is used to designate the order that the metal layer appears above the substrate SUB with respect to a stack of the metal layers according to conventional notation in the art. In the example of this embodiment illustrated in FIG. 1, the second power mesh PM is formed in the metal-4 layer M4 and the metal-5 layer M5.

Still referring to FIG. 1, the first and second power meshes each comprise a power strap in a lower one of metal layers (a layer relatively close to the substrate) and a power rail in an upper one of metal layers (a layer relatively far from the substrate). For example, the first power mesh PM includes a power strap PS in the metal-1 layer M1, and a power rail PR in the metal-2 layer M2 or in the metal-3 layer M3. However, embodiments of the inventive concept are not limited to such a feature; instead, the power rail of a power mesh may be located under its power strap. Moreover, embodiments of the inventive concept are not limited to the power meshes PM being formed in the particular metal layers shown. Thus, the example shown in FIG. 1 will be used below for descriptive purposes only.

A plurality of unit cells CE may be disposed on the substrate SUB. For example, the plurality of unit cells CE may be formed in contact with a first surface 101 of the substrate SUB. The plurality of unit cells CE may be information storage devices of various logic gates such as AND gate, OR gate, and NOT gate (inverter), or a latch or flip-flop. Each of the unit cells CE comprises circuitry including electronic components such as at least one transistor or capacitor. The unit cells CE may be memory cells or combinational logic circuits in which logic gates or circuit devices are combined. In any case, the unit cells CE may be simply considered as blocks of basic electronic components that are laid out in units by the design tool (e.g., software) used to design the system-on-chip. An example in which the unit cells CE include an AND logic gate and an inverter will be used for convenience in the description that follows.

As referred to above, in this example, metal layers M1, M2, M3, M4, M5 and M6 are stacked on the substrate SUB in a first direction (T direction). Among the metal layers M1, M2, and M3, the metal-1 layer M1 includes a terminal P of the unit cell CE. For example, an input/output terminal of the AND gate is located in the metal-1 layer M1. A power terminal F of the unit cell CE may also be located in the metal-1 layer M1. In addition, among the metal layers M1, M2, and M3, signal lines SL for routing signals are located in the metal-2 and metal-3 layers M2 and M3. The signal lines in different metal layers may be connected to each other via a cell via VC to form the signal rout. If the number of metal layers is greater than that shown in the example of FIG. 1, the additional metal layers may include signal lines as well. The terminals P of the unit cell CE and the signal line SL may be formed of metal such as copper. In each of the metal layers M1, M2, and M3, regions other than the terminal P of the unit cell CE and the signal line SL may be insulating material. Also, insulating layers 102 may be interposed between the metal layers M1, M2, and M3. The insulating material or the insulating layers 102 may be formed of silicon oxide.

As mentioned above, the power mesh PM includes a power rail PR and power strap PS. The power rail PR is connected to the power terminal (F in FIG. 2) of the unit cell CE so as to supply power to the unit cell CE from the power strap PS. The power rail PR and power strap PS are connected to each other by a cell via VC. Thus, the power rail PR may supply electric power to the unit cell CE through the cell via VC. The power terminal F of the unit cell CE receives the electric power through a metal contact MC that is connected to the metal-1 layer M1.

The power strap PS may receive the electric power from a voltage converter (not shown) located in the system-on-chip 100 or outside the chip, and supplies the electric power to the power rail PR. In the example shown in FIG. 1, the power strap PS is disposed on the first regions REGION 1 as laterally offset from the unit cell CE. That is, in the example in which the power strap is located in the metal-1 layer, the unit cell CE may be located under a region of the metal-1 layer M1 that does not include the power strap PS.

In the embodiment described above and shown in the FIGS. 1 and 2, the system-on-chip 100 includes a power strap PS in the metal-1 layer M1 in which a terminal of a unit cell CE is also located. That is, the power strap PS is provided in a metal layer used to provide signal routing. Thus, this increases freedom in the design/layout of the signal routs. Accordingly, the footprint of the system-on-chip 100 may be minimized and yet signals may be reliably transmitted within the system-on-chip 100.

More specifically, the system-on-chip 100 is highly integrated, and yet the signal lines SL can be arranged to prevent interference. In particular, the signal lines SL adjacent to each other in the first direction (T direction) or the signal lines SL adjacent to each other in a second direction that is perpendicular to the first direction can be arranged at intervals that are at least equal to the width of the signal lines SL.

Figure 3:
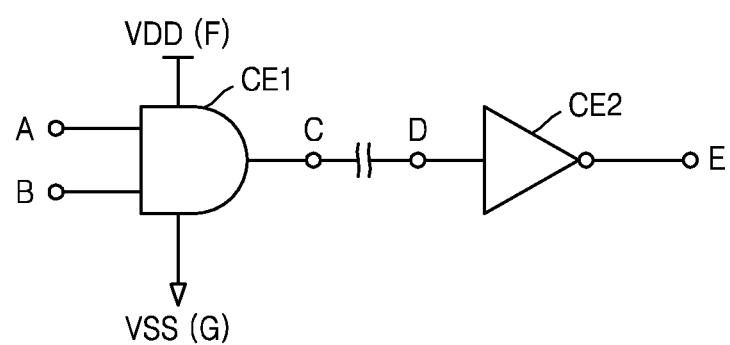
FIG. 3 is a circuit diagram of an example of circuitry constituted by unit cells of the system-on-chip.

FIGS. 2 and 3 illustrate the unit cells in FIG. 1 as the aforementioned AND gate (first unit cell CE1) and inverter (second unit cell CE2) in the system-on-chip 100. Terminals A, B, and C of the first unit cell CE1 are located in the metal-1 layer M1. For example, an output terminal C of the first unit cell CE1 may be connected to the second unit cell CE2 via the signal lines located in the metal-2 layer M2 and the metal-3 layer M3. The signals may be transferred to an input terminal D of the second unit cell CE2 located in the metal-1 layer M1 via the metal-3 layer M3 and the metal-2 layer M2. As described above, signals may be transmitted via the metal contacts MC and via contacts VC shown in FIG. 1. Signal routs in the system-on-chip 100 to other unit cells CE may by provided by connections (signal lines), in addition to those leading to and from the first and second unit cells CE1 and CE2 shown in FIG. 2.

The signal routing may be concentrated in regions where the unit cells CE are not located. FIG. 2 shows an example in which the signal routs connecting the first and second unit cells CE1 and CE2 are concentrated in a physical cell PC region. The physical cell region PC is a cell where none of the predetermined functions (for example, OR, AND, and charge storage) of the unit cells CE are performed (e.g., is a dummy cell).

Still referring to FIG. 2, power rails PR and ground rails may be alternately arranged in parallel with each other. Also, the first unit cell CE1 and the second unit cell CE2 may share a power rail PR. However, for example, the first and second unit cells CE1 and CE2 may receive the power through several power rails PR connected to each other by power vias VP.

Figure 4:
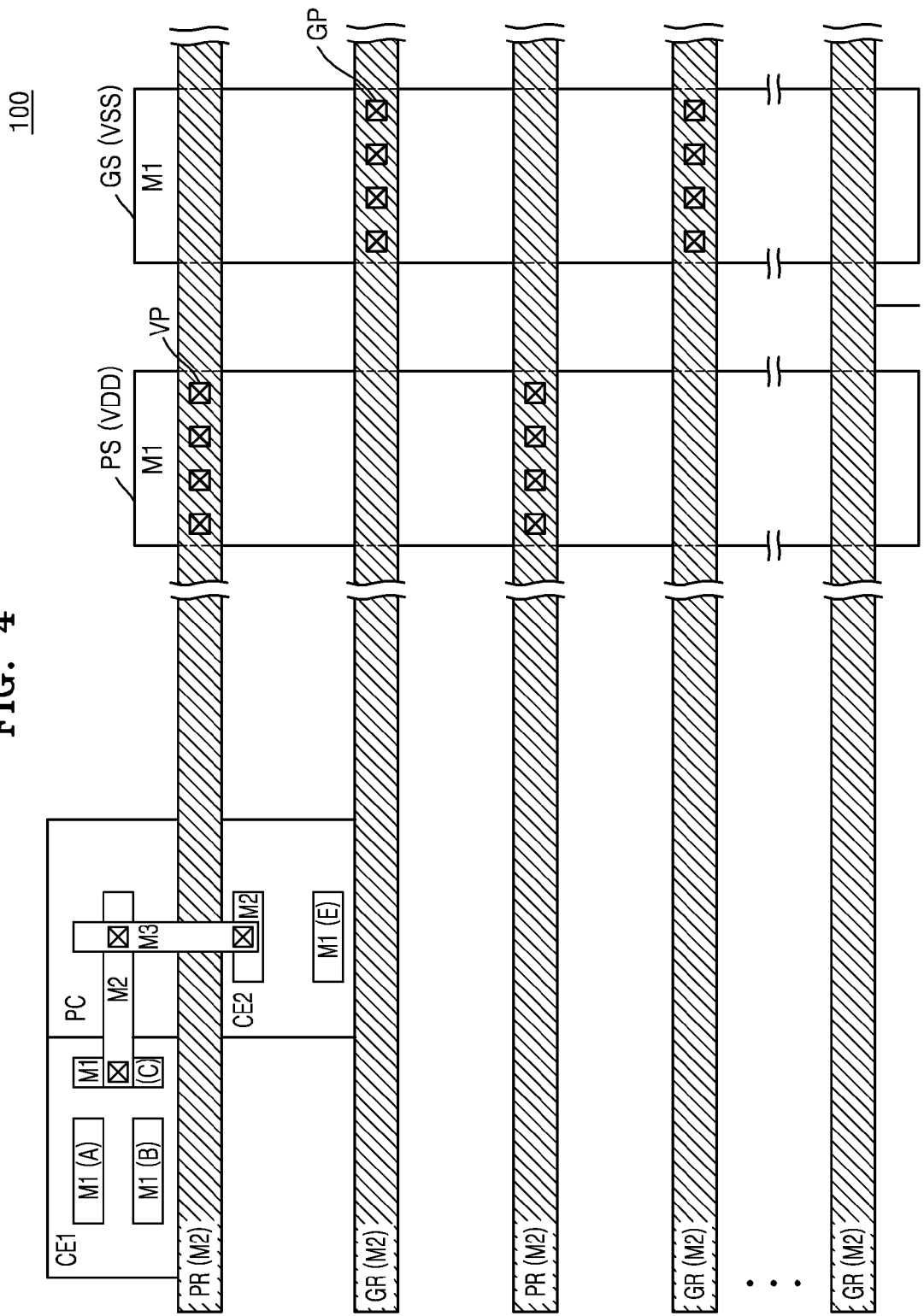
FIG. 4 is a partial plan view of the system-on-chip showing the addition of a ground voltage mesh.

FIG. 4 shows an example of the application of a ground mesh to the system-on-chip 100 in the present embodiment. Referring to FIG. 4, the system-on-chip 100 further includes a ground rail GR and a ground strap GS. The ground rail GR is connected to the ground terminal (G of FIG. 3) of the unit cell CE so as to connect the unit cell CE to the ground strap GS. The ground strap GS may be located in the metal-1 layer M1, like the power strap PS. In addition, the ground rail GR is connected to the ground strap GS via at least one ground via GP and may be located in the metal-2 layer M2. In another example of this embodiment, the ground rail GR is located in the metal-3 layer M3.

In the example of FIG. 4, the power rails PR and the ground rails GR are alternately disposed, and the power strap PS and the ground strap GS are adjacent to each other. Like the power strap PS, the ground strap GS may be located in the metal-1 layer M1 on that part of the region REGION 1 which does not contain any of the unit cells CE.

Figure 5:
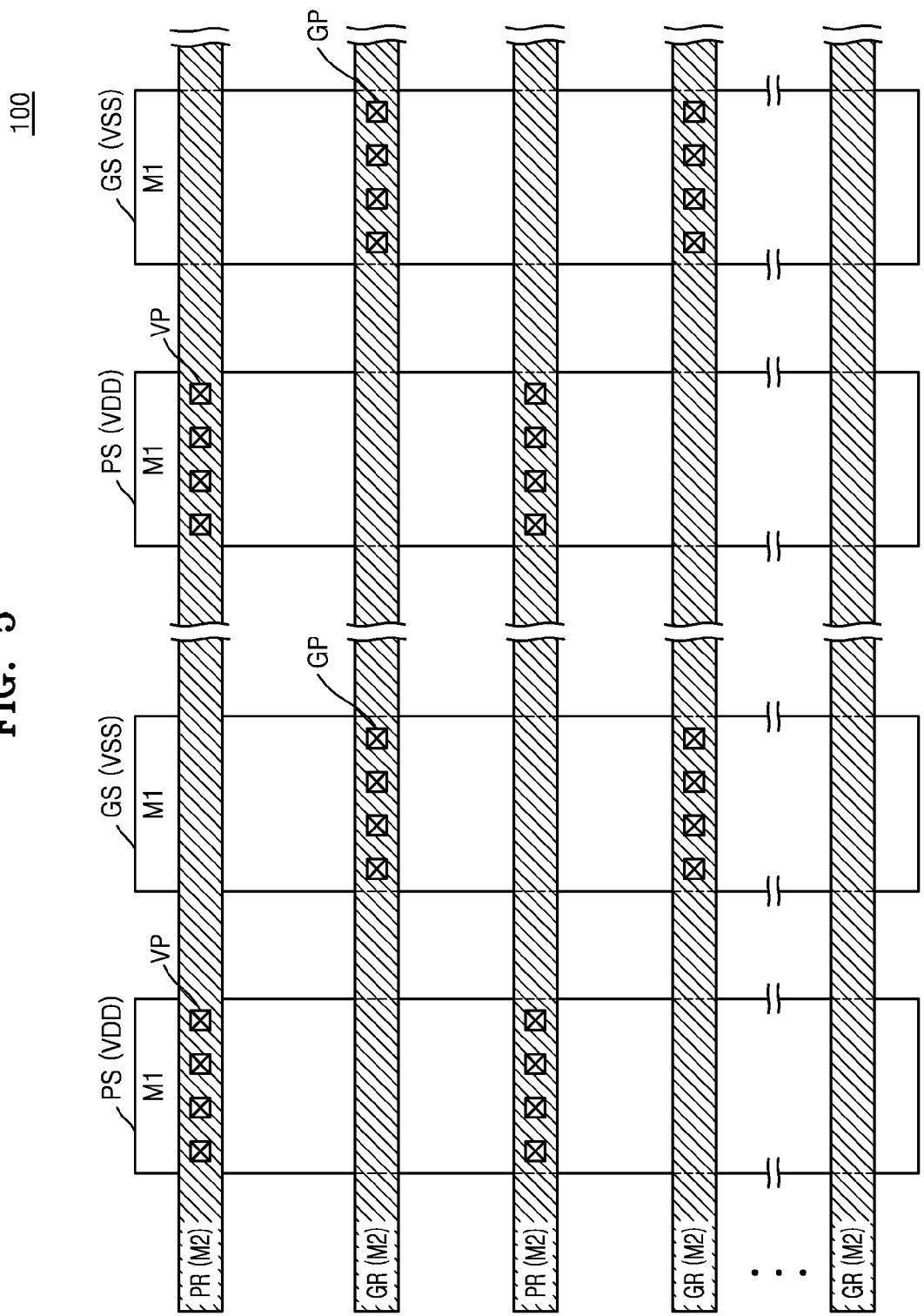
FIG. 5 is a partial plan view of another example of the system-on-chip according to inventive concept.

FIG. 5 shows another example of the system-on-chip 100 according to the inventive concept. Referring to FIG. 5, the system-on-chip 100 includes a plurality of power straps PS and a plurality of ground straps GS. The number of power straps PS and the number of ground straps GS may be provided based on the footprint of the system-on-chip 100, the number of unit cells CE that are provided in the system-on-chip 100, and an electric power required by the system-on-chip 100 or an electronic device including the system-on-chip 100.

Figure 6:
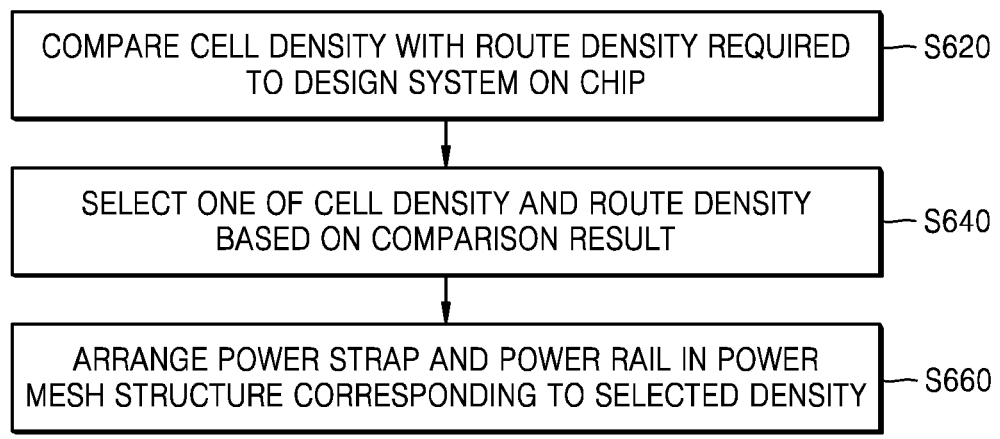
FIG. 6 is a flowchart of an embodiment of a method of designing a system-on-chip according to the inventive concept.

FIG. 6 is a flowchart illustrating an embodiment of a method of designing a system-on-chip 100, according to the inventive concept.

Referring to FIGS. 1 and 6, this embodiment of a method of designing the system-on-chip 100 includes comparing a cell density and a rout density required to implement the system-on-chip 100 (S620), selecting one of the cell density and the rout density based on a result of the comparison (S640), and laying out the power straps PS and the power rails PR of a power mesh structure according to the selected cell density or rout density (S660).

The cell density refers to the integration density of the unit cells CE, and the rout density refers to the integration density of the signal routs in the system-on-chip 100. For example, if 60 unit cells CE are required and the substrate SUB of the system-on-chip 100 has an area corresponding to 100 cells (including the unit cells CE and the physical cells PC in which the signal lines are concentrated), the cell density is 0.6 and the rout density is 0.4. In this method, the locations of the physical cells PC are set, then the locations of the unit cells CE are set, and then the power mesh(es) PM is/are designed.

Figure 7:
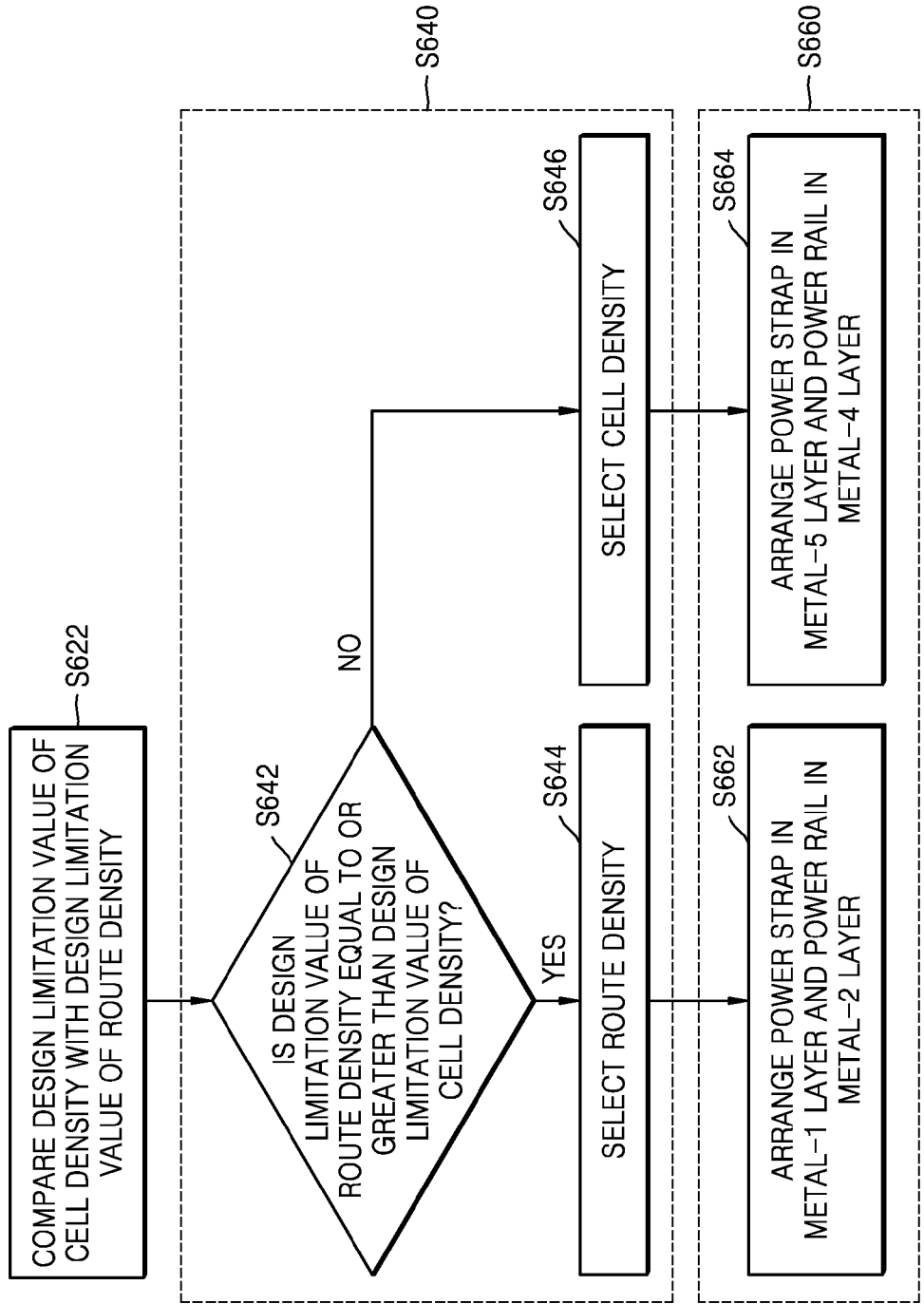
FIG. 7 is a flowchart of an example of the method of designing the system-on-chip of FIG. 6.

FIG. 7 is a flowchart illustrating an example of the method of designing the system-on-chip of FIG. 6.

Referring to FIG. 7, the comparing operation (S620 of FIG. 6) may include an operation of comparing a design limit of the cell density with a design limit of the rout density (S622). The design limits are quantified as "limitation values" of a difference between an allowable maximum value of the cell density or the rout density and actual requirement of the cell density or the rout density, and may each be expressed as a percentage (%). In the example given above, if the actually required cell density is 0.6 and the allowable maximum value of the cell density is 0.8, the design limitation value of the cell density is 75%. The allowable maximum value of the cell density and the rout density may be determined by various design parameters such as performances of the system-on-chip 100, the layout area (footprint of the system-on-chip), electric power, and production costs.

In the selecting operation (S640 of FIG. 6), the rout density (S644) may be selected when the design limitation value of the rout density is equal to or greater than that of the cell density (YES to S642), and the cell density (S646) may be selected when the design limitation value of the rout density is less than that of the cell density (NO to S642).

The arranging operation (S660 of FIG. 6) may include arranging the power strap PS in the metal-1 layer M1 and arranging the power rail PR in the metal-2 layer M2 (S662) when the rout density is selected in operation S644. After arranging the power strap PS, the unit cells CE are arranged in regions laterally offset from that where the power strap PS is located. In this example, the metal-1 layer M1, despite including the power strap PS, may accommodate a wide range of possible signal routs. Accordingly, the footprint of the system-on-chip 100 may be minimized while still ensuring reliable signal transmission.

Figure 8:
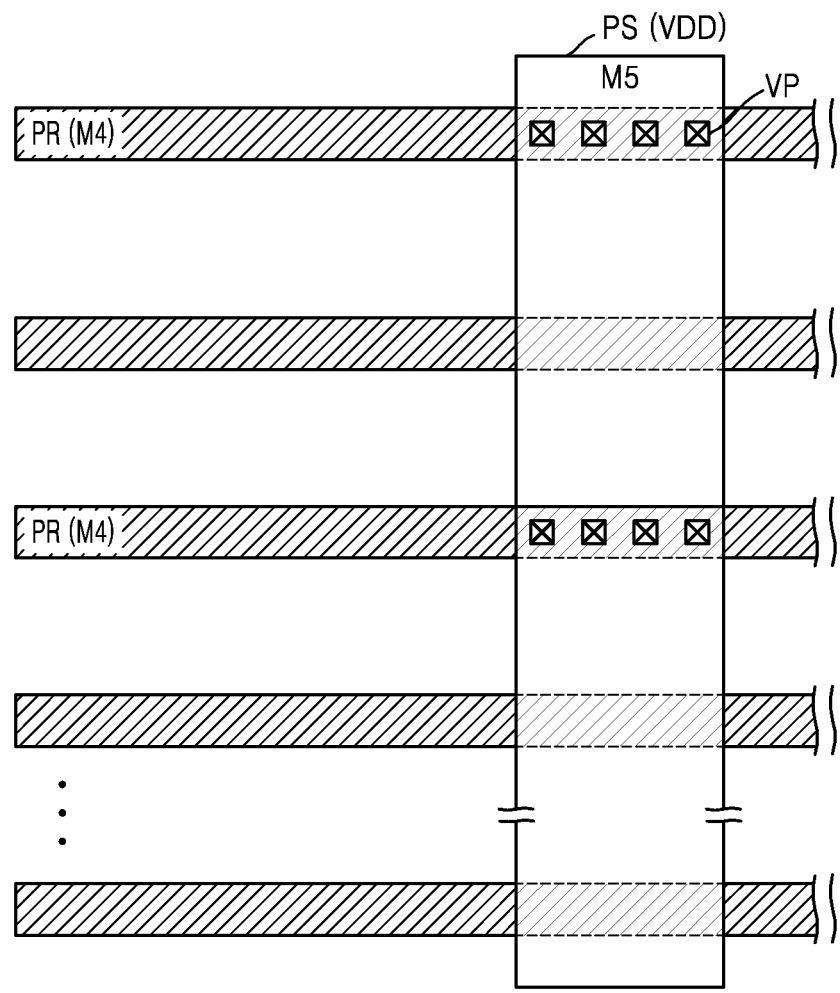
FIG. 8 is a plan view of part of a system-on-chip designed when an operation of the method of FIG. 7 is executed.

FIG. 8 is a diagram showing an example of a layout of a system-on-chip 100 when operation S664 of FIG. 7 is executed.

Referring to FIGS. 7 and 8, the power strap PS is arranged in the metal-5 layer M5 and the power rail PR is arranged in the metal-4 layer M4 (S664) as shown in FIG. 8 when the limit on the rout density imposed by the design specifications is less than the limit on cell density (S642, S646 in FIG. 7). In this case, the area in which the unit cells CE can be provided is not reduced by the power strap PS. Thus, the number of unit cells CE that may be provided may be maximized.

As described above, according to the method of designing the system-on-chip according to the one or more embodiments of the inventive concept, a trade-off relation is set between cell utilization and rout utilization so as to reduce the layout area of the system-on-chip or form a variety of structures in the system-on-chip.

Figure 9:
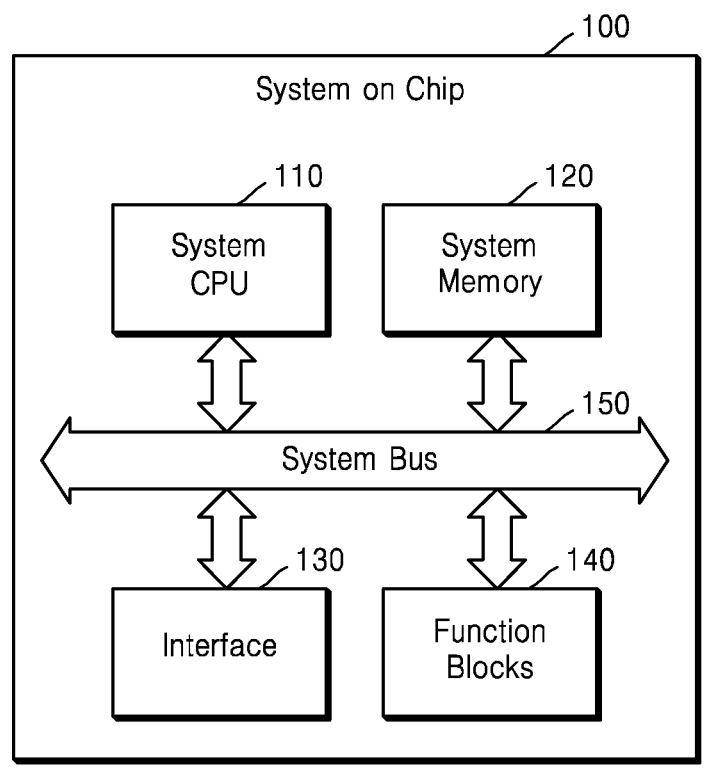
FIG. 9 is a block diagram of a system-on-chip according to the inventive concept.

FIG. 9 illustrates an embodiment of a system-on-chip 100 according to the inventive concept.

Referring to FIG. 9, the system-on-chip 100 may include a central processing unit (CPU) 110, a system memory 120, an interface 130, functional blocks 140, and a bus 150 connecting the functional blocks 140. The CPU 110 controls operations of the system-on-chip 100. The CPU 110 may include a core processor and an L2 cache. For example, the CPU 110 may include multi-core processor. Each core of the multi-core processor may perform the same as or differently from the other cores. Also, each core may be activated simultaneously with other cores or at different time points from the other cores. The system memory 120 may store results of processes performed by the functional blocks 140 under the control of the CPU 110. For example, content stored in the L2 cache of the CPU 110 is flushed to be stored in the system memory 120. The interface 130 may provide an interface with external devices such as a camera, a liquid crystal display (LCD) device, and/or a speaker. The functional blocks 140 may perform various functions required of the system-on-chip 100. For example, the functional blocks 140 may perform video coding or may execute three-dimensional (3D) graphic operations.

Figure 10:
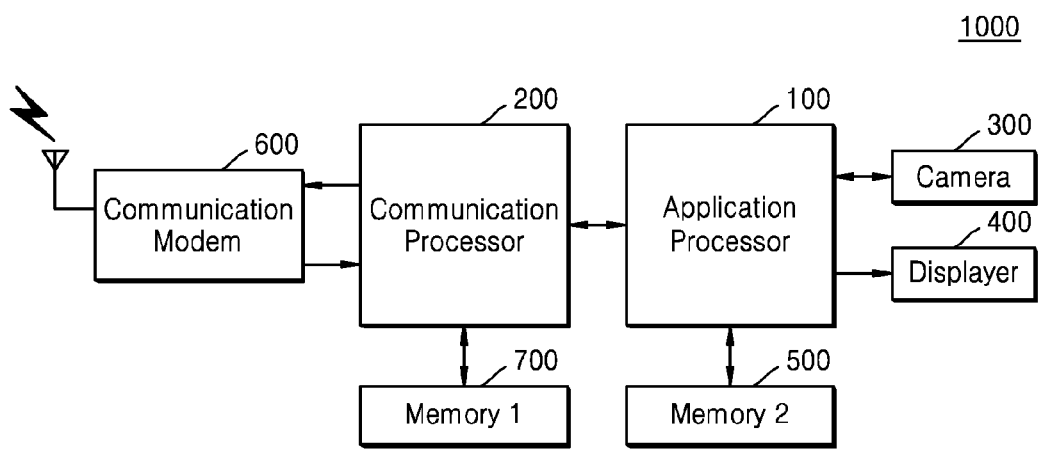
FIG. 10 is a block diagram of a mobile device according to the inventive concept.

FIG. 10 illustrates an embodiment of a mobile device 1000 including system-on-chip 100, according to the inventive concept.

Referring to FIG. 10, the mobile device 1000 includes an application processor constituted by the system-on-chip 100, a communication processor 200, a camera 300, a display 400, a communication modem 600, and memories 500 and 700. In the mobile device 1000, applications may be executed by the application processor 100. For example, when the camera 300 captures an image, the application processor 100 may store the captured image in the memory 500 and display the captured image on the display 400. The captured image may be transmitted to the outside via the communication modem 600 under the control of the communication processor 200. The communication processor 200 may temporarily store the image in the memory 700. The communication processor 200 may control communications for phone calls and data transmission.

Figure 11:
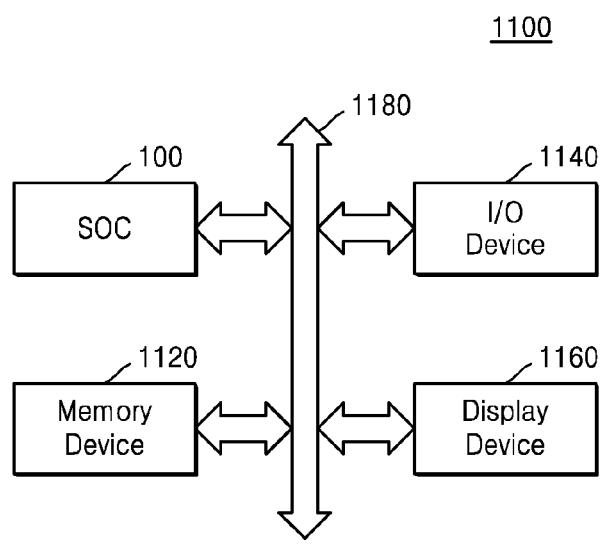
FIG. 11 is a block diagram of a computing device according to the inventive concept.

FIG. 11 illustrates an embodiment of a computing system 1100 including a system-on-chip 100, according to the inventive concept.

The computing system 1100 may be a mobile device, a desk top computer, or a server. Also, the computing system 1100 may include a memory device 1120, an input/output device 1140, and a display device 1160, which may all be electrically connected to a bus 1180.

In embodiments of a system-on-chip according to the inventive concept, a power strap is provided in the same metal layer in which terminals of the unit cells are formed. Thus, the number of signal routs along which signals are to be transmitted to and/or from the unit cells may be maximized. Accordingly, the footprint of the system-on-chip may be minimized while reliable signal transmission is nonetheless ensured.

Also, embodiments of a system-on-chip according to the inventive concept establish a trade off between cell utilization and rout utilization such that the footprint of the chip can be minimized or the variety/number of blocks of the system-on-chip can be maximized.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A system-on-chip comprising:
a substrate comprising a first region and a second region that is disposed laterally relative to the first region;
a plurality of unit cells disposed at an upper surface of the substrate, each of the plurality of unit cells having electronic components and a power terminal through which power is supplied to the electronic components of the cell;
a first metallization layer comprising a first power rail electrically connected to the power terminal of each of the plurality of unit cells;
a second metallization layer comprising a first power strap,
wherein one of the first and second metallization layers is stacked on the other of the first and second metallization layers, and
the power strap and the power rail are electrically connected to each other, and constitute a first power mesh;
a third metallization layer; and
a fourth metallization layer,
wherein one of the third and fourth metallization layers is stacked on the other of the third and fourth metallization layers,
the third and fourth metallization layers are both stacked on the first and second metallization layers,
the third and fourth metallization layers comprise a second power mesh disposed above levels of the power strap and power rail of the first power mesh in the device,
the first power mesh lies over the first region of the substrate, and
the second power mesh lies over the second region of the substrate.

2. The system-on-chip of claim 1, wherein the first metallization layer is a metal-2 layer and the second metallization layer is a metal-1 layer.

3. The system-on-chip of claim 1, wherein the first metallization layer is a metal-1 layer and the second metallization layer is a metal-2 layer.

4. The system-on-chip of claim 1, wherein the third metallization layer is a metal-4 layer, a metal-5 layer, or a metal-6 layer.

5. The system-on-chip of claim 1, wherein the third metallization layer or the fourth metallization layer over the second region comprises signal lines.

6. The system-on-chip of claim 1, wherein a rout density above the first region is greater than a rout density above the second region in the system-on-chip, rout density being a measure of the density of conductors providing signal routing in the system-on-chip.

7. The system-on-chip of claim 1, wherein a cell density of the unit cells at the upper surface of the first region of the substrate is less than a cell density of the unit cells at the upper surface of the second region of the substrate.

8. The system-on-chip of claim 1, wherein the substrate has a plurality of the first regions isolated from each other at an upper portion of the substrate.

9. The system-on-chip of claim 1, wherein the first metallization layer comprises parallel power rails of the first power mesh, and
the power strap of the first power mesh crosses the parallel power rails of the first power mesh as viewed in plan.

10. A system-on-chip comprising:
a substrate comprising a first region and a second region that is disposed laterally relative to the first region;
a plurality of unit cells at an upper portion surface of the substrate, each of the plurality of unit cells having electronic components and a power terminal through which power is supplied to the electronic components of the cell; and
a first metallization layer comprising a power strap;
a second metallization layer comprising a power rail electrically connected to the power terminal of each of the plurality of unit cells
a third metallization layer and a fourth metallization layer that are stacked on the first metallization layer and the second metallization layer,
wherein the power strap and the power rail are electrically connected to each other, and constitute a first power mesh,
the third and fourth metallization layers comprise a second power mesh,
the power strap is electrically connected to the power terminal of each of the plurality of unit cells through the power rail,
the first metallization layer comprising the power strap is interposed between the substrate and the second metallization layer,
the first power mesh lies over the first region of the substrate, and
the second power mesh lies over the second region of the substrate.

11. The system-on-chip of claim 10, wherein the substrate has a plurality of the first regions isolated from each other at an upper portion of the substrate.

12. The system-on-chip of claim 11, wherein the first metallization layer comprises parallel power rails of the first power mesh, and
the power strap of the first power mesh crosses the parallel power rails of the first power mesh as viewed in plan.

13. A system-on-chip comprising:
a substrate comprising a first region and a second region that is disposed laterally relative to the first region;
a plurality of metallization layers stacked one above the other on the substrate; and
first and second unit blocks of circuitry at an upper surface of the substrate, the circuitry of each of the first and second unit blocks including a power terminal through which power is supplied to the circuitry, and
wherein the plurality of metallization layers include first, second, third and fourth metallization layers;
the first metallization layer comprises a conductive power rail electrically connected to the power terminal of each of the first and second unit blocks of circuitry, the power rail extending longitudinally in a first direction over the substrate, the second metallization layer comprises a conductive strap extending in a second direction perpendicular to the first direction, the conductive power rail and the conductive strap cross each other and are electrically connected, the conductive power rail and the conductive strap constitute a first power mesh, the conductive strap is disposed laterally of the first and second unit blocks of circuitry and lies over a region of the upper surface of the substrate that is devoid of circuitry, the third and fourth metallization layers comprise a second power mesh, the first power mesh lies over the first region of the substrate, and the second power mesh lies over the second region of the substrate.

14. The system-on-chip as claimed in claim 13, wherein the first and second metallization layers are metal-1 and metal-2 layers of the chip.

15. The system-on-chip as claimed in claim 13, further comprising a physical block of space at the upper portion of the substrate unoccupied by any unit block of circuitry, wherein the first metallization layer comprises at least one signal line that runs over the physical block and electrically connects the circuitry of the first and second unit blocks to one another.

16. The system-on-chip as claimed in claim 15, wherein the third metallization layer comprises a signal line that with the at least one signal line of the one of the plurality of metallization layers electrically connects the circuitry of the first and second unit blocks to one another.

17. The system-on-chip as claimed in claim 13, wherein the first metallization layer comprises parallel power rails constituting the first power mesh, and the conductive strap is electrically connected to the parallel power rails.

18. The system-on-chip of claim 10, wherein the first metallization layer also comprises the power terminal of each of the plurality of unit cells.

\* \* \* \* \*